United States Patent [19]
Chou et al.

[11] Patent Number: 5,942,373
[45] Date of Patent: Aug. 24, 1999

[54] PATTERN OR VIA STRUCTURE FORMED THROUGH SUPPLEMENTAL ELECTRON BEAM EXPOSURE AND DEVELOPMENT TO REMOVE IMAGE RESIDUE

[75] Inventors: William T. Chou, Cupertino; Solomon I. Beilin, San Carlos; Wen-chou Vincent Wang, Cupertino, all of Calif.

[73] Assignee: Fujitsu Limited, Japan

[21] Appl. No.: 09/013,000

[22] Filed: Jan. 26, 1998

Related U.S. Application Data

[62] Division of application No. 08/639,283, Apr. 25, 1996, Pat. No. 5,789,140.

[51] Int. Cl.$^6$ ....................................................... G03F 7/40
[52] U.S. Cl. ......................... 430/296; 430/320; 430/328; 430/331; 430/942
[58] Field of Search ..................................... 430/296, 328, 430/331, 320, 321, 942

[56] References Cited

U.S. PATENT DOCUMENTS

| | | | |
|---|---|---|---|
| 4,061,832 | 12/1977 | Roberts | 428/500 |
| 4,371,423 | 2/1983 | Yoshizawa . | |
| 4,504,558 | 3/1985 | Bohlen et al. | 430/30 |
| 4,543,319 | 9/1985 | Chao et al. | 430/312 |
| 4,567,132 | 1/1986 | Fredericks et al. | 430/312 |
| 4,702,993 | 10/1987 | White et al. | 430/296 |
| 4,703,559 | 11/1987 | Ehrfeld et al. . | |
| 4,876,177 | 10/1989 | Akahoshi et al. | 430/313 |
| 4,961,259 | 10/1990 | Schreiber . | |
| 5,104,772 | 4/1992 | Kobayashi et al. | 430/296 |
| 5,112,724 | 5/1992 | Bradshaw | 430/396 |
| 5,153,103 | 10/1992 | Kotachi et al. | 430/296 |
| 5,229,258 | 7/1993 | Sezi et al. . | |
| 5,252,430 | 10/1993 | Hashimoto et al. | 430/296 |
| 5,334,804 | 8/1994 | Love | 174/267 |
| 5,468,595 | 11/1995 | Livesay | 430/296 |
| 5,722,162 | 3/1998 | Chou et al. . | |

FOREIGN PATENT DOCUMENTS 1-304-457-A   8/1989   Japan .

OTHER PUBLICATIONS

W.R. Livesay, "A New Compact Electron Beam Curing System," Radtech 1990—North American Conference, Chicago, IL, Mar. 25–29, 1990, pp. 1–6.

W.R. Livesay, "Large Area Electron Beam Source," Electron Vision Corporation, San Diego, CA, Jun. 1–4, 1993, pp. 1–9.

W.R. Livesay, et al., "Electron Beam Hardening of Photoresist," SPIE Microlithography 1993 Conference, 1993.

Matthew Ross, "Chemical Analysis of Electron Beam Curing of Positive Photoresist," SPIE vol. 2195, pp. 834–848, May, 1994.

W.R. Livesay, "Vertical Lithography—Controlling Resist Profiles in Optical Lithography With a Large Area Electron Beam," SPIE vol. 2194, pp. 355–365, Jan. 1994.

*Primary Examiner*—Christopher G. Young
*Attorney, Agent, or Firm*—Coudert Brothers

[57] ABSTRACT

Methods of forming patterns in photo-sensitive resist layers with high aspect ratio features are described. The photosensitive layer is patterned exposed to actinic radiation and thereafter developed. For high aspect ratio patterns, the inventors have often observed a residue of resist material at the bottom of such features, and that this residue interferes with subsequent processing, such as filling the pattern with metal by a plating operation. To remove this residue, the patterned locations of the resist are exposed to a low dose of low-energy electron beam radiation, preferably having energy of less than 6 KeV and dosage of less than 200 $\mu C/cm^2$. After the electron beam exposure, the aperture is again exposed to a developer solution, which may be of the same composition as the developer initially used to develop the patterns.

20 Claims, 2 Drawing Sheets

PATTERN OR VIA STRUCTURE FORMED THROUGH SUPPLEMENTAL ELECTRON BEAM EXPOSURE AND DEVELOPMENT TO REMOVE IMAGE RESIDUE

This is a divisional application of application Ser. No. 08/639,283, filed Apr. 25, 1996 now U.S. Pat. No. 5,789,140.

FIELD OF THE INVENTION

The present invention generally relates to processing and fabrication methods for integrated-circuit chip packaging technology, and to the use of photo-imageable layers, such as photo-sensitive layers and photo-resist layers. More particularly, the present invention relates to forming patterns in photo-sensitive resist layers, with such patterns capable of having high aspect ratio features.

BACKGROUND OF THE INVENTION

The present invention is directed to forming patterns in photo-imageable layers, such as for example photoresist layers. Photoresists, as well as all photo-imageable materials, are generally classified into two groups: positive-type materials and negative-type materials. Positive-type materials become soluble in a developer solution (e.g., alkaline-aqueous solution) when exposed to light radiation, usually ultraviolet. Negative-type materials become insoluble in a developer solution (e.g., an organic solvent) when exposed to light radiation. In either case, the light generally must be within a given range of wavelengths, the range being a function of the chemical and optical properties of the particular photo-imageable material. Light within the wavelength range is often referred to as "actinic" radiation. As used herein, actinic radiation for a given material is any electromagnetic radiation having a wavelength capable of activating that material.

A typical negative photoresist comprises a synthetic polymer resin (e.g., cyclized polyiosoprene rubber), a photo-initiator chemical (e.g., azide compounds), and a solvent base. The solvent base dissolves the resin and initiator chemical, which are usually solid or near solid. This enables the photoresist to readily coat a desired substrate (e.g., semiconductor wafer, ceramic substrate) to form a photoresist layer thereon. After coating, the solvent is evaporated from the substrate by exposure to moderate heat ("soft bake"), leaving the resin and photo-initiator as a hard layer.

The resin of a negative-type photoresist generally comprises polymer chains, each chain having one or more unsaturated carbon bonds. With sufficient energy, unsaturated bonds from two such chains may be bonded to form a saturated carbon bond. This cross-inks the chains and, in combination with other cross-links to other chains, renders the photoresist substantially insoluble in a selected organic solvent. The energy is generally provided by way of the photo-initiator chemical. Upon exposure to actinic radiation, the molecules of the photo-initiator absorb energy from the radiation and interact with chains to form cross links. Some resins are capable of cross-linking without the aid of a photo-initiator and are directly responsive to the actinic radiation.

A typical positive photoresist comprises a resin, a photo-sensitizer chemical, and a solvent base. As before, the solvent base dissolves the resin and sensitizer chemical, and is evaporated after the wafer has been coated to form a layer thereon. The resin's polymer chains are normally insoluble in alkaline-aqueous solutions. Upon exposure to actinic radiation, the molecules of the photo-sensitizer decompose into acidic products which, in the presence of an alkaline-aqueous solution, promote the dissolving of the polymer chains. The exposed portions of the positive-type photoresist then become soluble in an alkaline aqueous solution.

In use, a typical photoresist (either positive- or negative-type) is coated on the wafer to form a photoresist layer, soft-baked to remove the solvent base from the layer, and then exposed to actinic radiation through a mask. The mask transfers its pattern to the photoresist layer. The photoresist layer is then developed by exposure to an appropriate developer solution. For a negative photoresist, the unexposed portions of photoresist dissolve in the developer solution. For a positive photoresist, the exposed portions dissolve. A pattern is then left on the wafer for further processing. Once the remaining photoresist layer is no longer needed, it may be removed by exposure to an organic solvent called a stripper.

In addition to positive- and negative-type photoresists, there are image-reversal (or reversing) photoresists (IRP's), which are positive-type photoresists which can be post-treated to reverse the initially exposed images therein. IRP resists are also called dual tone resists, and are classified as positive resists because their chemical structures are closest to those of positive photoresists. In an unexposed state, IRP materials are insoluble in alkaline aqueous solutions (the developers). After exposure to actinic radiation through a mask, the exposed portions become soluble in an alkaline aqueous solution. The unexposed portions remain insoluble. The IRP material may then be developed as a positive resist. In the alternative, the resist may be heated to a temperature of around 100° C.–160° C. to render the exposed portions insoluble. By then exposing the previously unexposed portions to the actinic radiation, the previously unexposed portions are rendered soluble in the alkaline aqueous solution. Accordingly, the initial mask image is reversed, and may be developed to form a negative image of the mask. The second exposure to actinic radiation may expose the entire layer ("blank flood" exposure) rather than just the previously unexposed portions.

It is known that forming pattern features with aspect ratios of greater than 2 in thin photoresist layers (<2 µm in thickness) is difficult due to optical diffraction effects. (The aspect ratio is the thickness of the photoresist layer, i.e., height, divided by the narrowest width of the feature.) It is known that diffraction effects become less of a problem as the width of the feature increases, which implies that it should be easier to form high aspect ratio structures in thicker photoresist layers. Although the inventors have generally found this to be true, they have found in some instances that a small residue of photoresist material remains at the bottom of a high-aspect ratio feature formed in a thick photoresist layer. These residues are approximately 0.2 µm thick, and have been observed most often when the thickness of the photoresist layer exceeds 60 µm and when the feature width at the top of the photoresist is less than 10 µm. Such residues generally interfere with subsequent processing, such as when the feature is filled with conductive material by electroplating, and with the function intended for the feature.

SUMMARY OF THE INVENTION

The inventors have discovered that such residues may be removed by exposing the residues to low-energy electron beam radiation and thereafter exposing the residues to a developer solution. The energy and dosage of the electron beam is sufficient to break apart the polymer chains of the residues (polymer scission), but not strong enough to cross-ink the polymer chains.

DETAILED DESCRIPTION OF THE INVENTION

Figure 1:
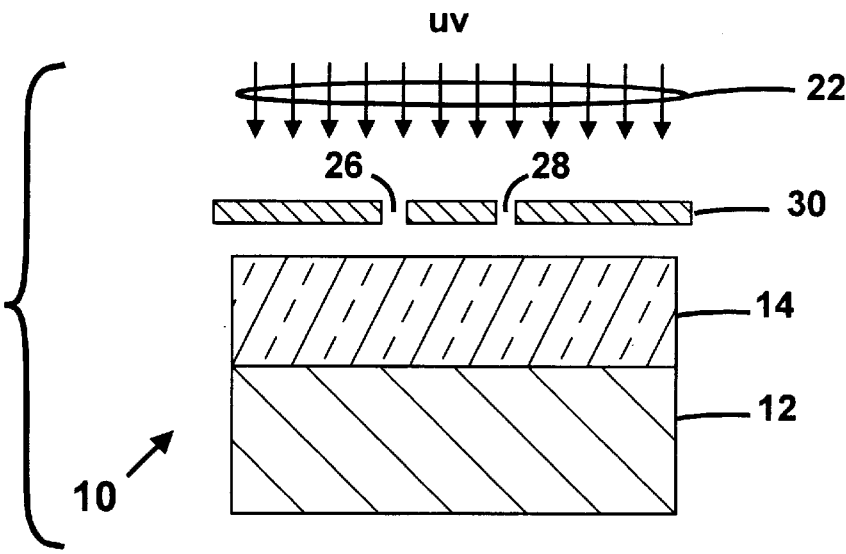
FIG. 1 shows a cross-sectional view of a layer of photosensitive material being exposed to actinic radiation through a mask having apertures of different widths.

FIG. 1 shows a cross-sectional view of a layer 14 of photosensitive material being exposed to ultraviolet light 22 through a mask 30 having two apertures 26 and 28. Layer 14 is formed upon a base substrate 12, which may comprise any type of material. In the example shown in FIG. 1, the layer 14 comprises a positive-type photosensitive material, such as AZ4620® positive photoresist series manufactured by the Hoechst Corporation, and ultraviolet light 22 is the actinic radiation for the photosensitive layer 14. Apetures 26 and 28 allow ultraviolet light 22 to pass through and penetrate layer 14 with two respective columns of ultraviolet light. The exposure will subsequently allow the material in layer 14 which underlies these two apertures to be later removed with the developer solution. Aperture 28 is smaller than aperture 26 and will diffract more of light 22 than aperture 26. As a result, less light will penetrate to the bottom of the column underlying aperture 28, increasing the risk that the photoresist at the bottom will not be fully activated.

Layer 14 may comprise other types of photoresist materials, such as negative-type photosensitive materials and image-reversal photosensitive materials. When using a negative-type photoresist material and an image reversal material (which is subsequently reversed), mask 30 would comprise the complementary image of that shown in FIG. 1. For example, mask 30 would be transparent in all places where features are not to be defined, and opaque where features are to be formed.

Figure 2:
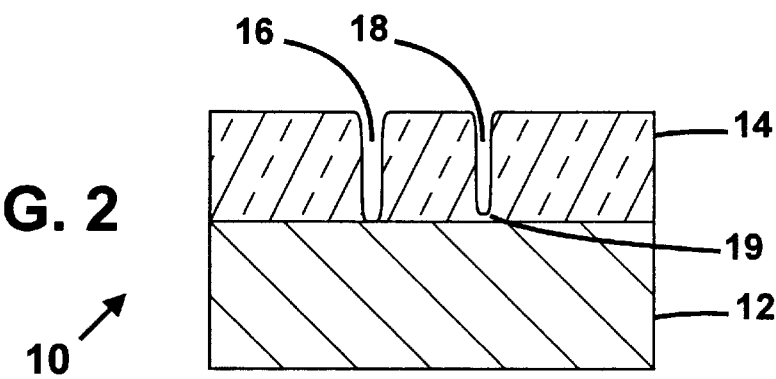
FIG. 2 shows a cross-sectional view of the exposed photosensitive layer after it has been developed; the cross-section shows two features of different widths, the feature of the smaller width having a residue at the bottom of the feature.

After exposure to actinic radiation, layer 14 is exposed to a conventional developer solution that is appropriate for the photosensitive material. As a result of the development, two vias 16 and 18 are formed, as shown in FIG. 2. Because aperture 26 is wider than aperture 28, via 16 which was defined by aperture 26, is wider than via 18. Via 16 reaches through a thickness of layer to the top of substrate 12. Due to narrower width, a small residue 19 of material remains at the bottom of via 18. Accordingly, via 18 does not extend all the way through layer 14, and does not touch substrate 12. Depending upon the intended use of via 18, the residue 19 may either interfere with or destroy the intended function of via 18 and/or the subsequent processing steps. For example, via 18 may be used as a form in which conductive material is electroplated so as to create an electrical interconnect post that is mechanically attached to substrate 12. Such posts are disclosed in U.S. Pat. No. 5,334,804, entitled "Wire Interconnected Structures For Connecting an Integrated Circuit to a Substrate," which is commonly assigned to the assignee of the present invention.

Figure 3:
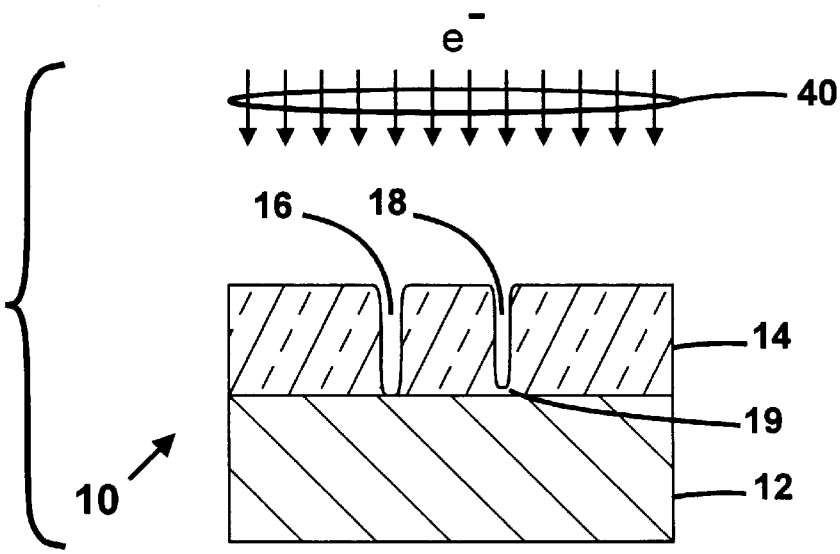
FIG. 3 shows a cross-sectional view of the patterned photosensitive layer being exposed to electron beam radiation according to the present invention.

The inventors have discovered that residue 19 may be removed by exposing it to a low-energy electron beam of around 2 KeV to 6 KeV, and with a dosage of less than 200 $\mu C/cm^2$. This exposure to electron beam radiation is shown by way of FIG. 3, where the entire surface of layer 14 is exposed to electron beam radiation. The inventors have found that the thickness of residue 19 is generally less than 0.4 $\mu$m, and is generally around 0.2 $\mu$m. With positive-type photoresists, the inventors have used electron beam energies of between 2 KeV and 4 KeV, at dosages which range between 50 $\mu C/cm^2$ and 150 $\mu C/cm^2$. The electron beam exposure may be performed by an electron beam curing system, such as the ELECTROCURE 30 manufactured by the Electron Vision Corporation. The ELECTROCURE 30 system can apply a substantially uniform electron beam over a 6 inch (152 mm) diameter circular area The system is pumped down to a vacuum of under 30 milliTorr.

Figure 4:
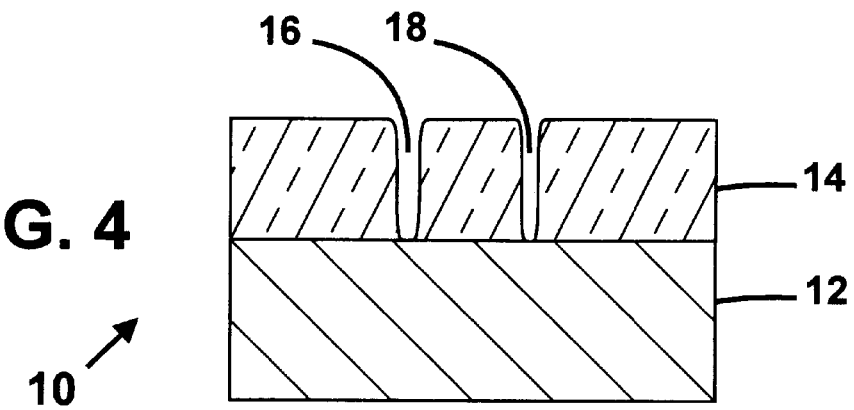
FIG. 4 shows a cross-sectional view of the photosensitive layer after it has been exposed to a second developer solution or to the same developer solution a second time; the cross-section shows that the residue in the smaller feature has been removed.

After electron beam exposure, the layer 14 is again exposed to a conventional developer solution, which may be the same developer solution used previously or a different one. The inventors have then found that the treated residue 19 is removed by the second developer step, as shown in FIG. 4. It is believed by the inventors that the electron beam exposure breaks apart the polymer chains of the photosensitive material in residue 19 so that they may be readily removed by the developer solution. The dosage generally is not high enough to cross link the polymer chains, which would make it more difficult to remove the residue.

Referring back to FIG. 3, which shows the electron beam exposure step, substrate 12 generally comprises a more dense material than layer 14. For example, photoresist materials generally have a density of around 1 gram per cm$^3$ (1 g/cm$^3$). In contrast, silicon has a density of 2.3 g/cm$^3$, gallium-arsenide has a density of 5.6 g/cm$^3$, alumina has a density of 3.96 g/cm$^3$, and common interconnect metals (aluminum, gold, silver, copper, aluminum, molybdenum, titanium) have densities at least of 2.4 g/cm$^3$, and typically well above 5 g/cm$^3$. Accordingly, there is generally a step difference in the density at the interface between substrate 12 and layer 14 of at least 2-to-1. The step difference causes a number of the electrons which reach substrate 12 to be back-scattered from the substrate 12 into residue 19 and surrounding areas. This effectively causes residue 19 to receive twice the exposure that it would normally receive. For instance, residue 19 receives twice as much dosage as the top surface of layer 14. Because the penetration depth of an electron beam with energy of 2 KeV to 6 KeV is generally less than 0.5 $\mu$m of photosensitive material, and because layer 14 is greater than 0.5 $\mu$m, there is little chance of electrons being back-scattered from substrate 12 to the top surface of layer 14.

Figure 5:
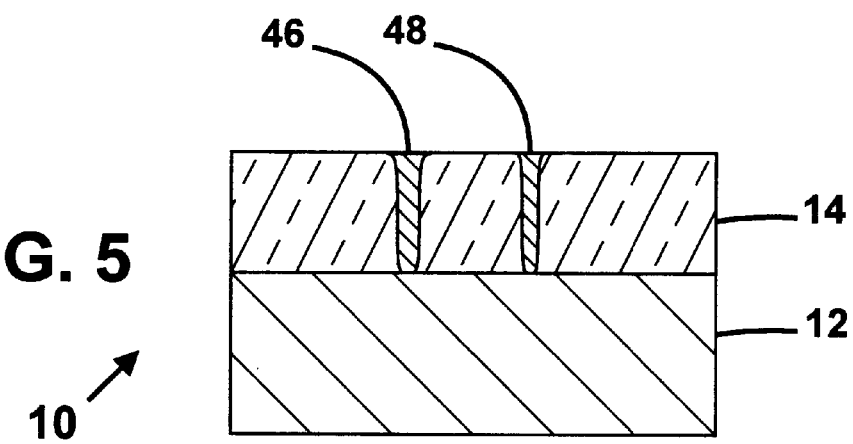
FIG. 5 shows a cross-sectional view of an application of the present invention where the features of the patterned and treated photosensitive layer are filled with conductive material.
Figure 6:
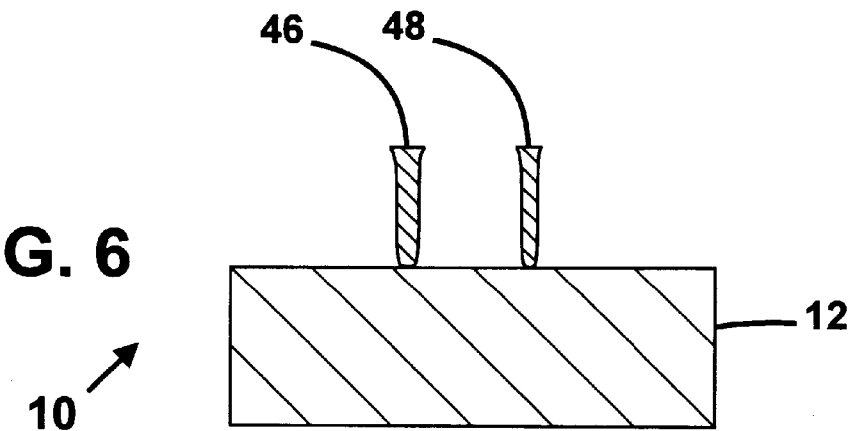
FIG. 6 shows a cross-sectional view of the application shown in FIG. 5 where the treated photosensitive layer is removed.

With the energies and dosages employed, the inventors have found that very little of the top surface of layer 14 is removed although substantially all of residue 19 is removed. It is believed by the inventors that because residue 19 receives approximately twice the electron dosage that the top surface of layer 14 receives, twice as many of the polymer chains are broken apart in residue 19 than at the top surface, which makes residue 19 much more soluble in the developer solution As one application of the methods of the present invention, via structures may be formed in layer 14 (as shown in FIG. 4), and then filled with conductive material to form conductive posts 46 and 48, as shown in FIG. 5. Electroless plating, electroplating, or a combination thereof may be used to fill the material. After forming post 46 and 48, layer 14 may be removed by a standard photoresist stripper, as shown in FIG. 6. For electroplating, a thin metal layer, such as one comprising chromium, may be formed over substrate 12 prior to forming layer 14. The thin metal layer is then removed after layer 14 is removed.

While the present invention has been particularly described with respect to the illustrated embodiment, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An article made by a photo-process, the photo-process comprising:

depositing a photo-sensitive resist layer having a thickness greater than about 60 microns;

exposing the photo-sensitive resist layer having a thickness greater than about 60 microns to a pattern of actinic radiation where a via structure is to be formed;

developing the pattern exposed resist layer to form said via structure, said via structure being developed such that a residue of resist material remains at the bottom of said via structure;

exposing said via structure to electron beam radiation having energy of less than about 6 KeV and dosage of less than about 200 $\mu C/cm^2$ to render said residue soluble in a developer solution; and thereafter developing the pattern exposed resist layer a second time such that said residue of resist material is removed from the bottom of said via structure.

2. The article of claim 1 wherein the energy of the electron beam radiation is between about 2 KeV and about 4 KeV.

3. The article of claim 1 wherein the dosage of the electron beam radiation is between about 50 $\mu C/cm^2$ and about 150 $\mu C/cm^2$.

4. The article of claim 1 wherein exposing said via structure to electron beam radiation includes exposing the entire resist layer to electron beam radiation.

5. The article of claim 1 further comprising plating a conductive material within said via structure after developing the pattern exposed resist layer a second time.

6. The article of claim 1 wherein depositing a photo-sensitive resist layer comprises depositing the resist layer on a substrate selected from the group consisting of silicon, gallium arsenide, and alumina.

7. The article of claim 1 wherein depositing a photo-sensitive resist layer comprises depositing the resist layer on a substrate having a density at least two times the density of the deposited resist layer.

8. An article made by a photo-process, the photo-process comprising:

depositing a photo-sensitive resist layer having a thickness greater than about 60 microns;

exposing the resist layer having a thickness greater than about 60 microns to a pattern of actinic radiation;

developing the pattern exposed resist layer to form a plurality of apertures, said plurality of apertures being developed such that at least one aperture includes a residue of resist material;

exposing the developed resist layer and the plurality of apertures to electron beam radiation having energy of less than about 6 KeV and dosage of less than about 200 $\mu C/cm^2$ to render said residue of resist material soluble in a developer solution; and thereafter contacting the resist layer and said residue of resist material with a developer solution such that said residue of resist material is removed from the at least one aperture.

9. The article of claim 8 wherein the energy of the electron beam radiation is between about 2 KeV and about 4 KeV.

10. The article of claim 8 wherein the dosage of the electron beam radiation is between about 50 $\mu C/cm^2$ and about 150 $\mu C/cm^2$.

11. The article of claim 8 wherein the at least one aperture includes a width less than about 10 microns.

12. The article of claim 8 further comprising plating a conductive material within said at least one aperture after contacting the resist layer and said residue of resist material with a developer solution.

13. The article of claim 8 wherein depositing a photo-sensitive resist layer comprises depositing the resist layer on a substrate selected from the group consisting of silicon, gallium arsenide, and alumina.

14. The article of claim 8 wherein depositing a photo-sensitive resist layer comprises depositing the resist layer on a substrate having a density at least two times the density of the deposited resist layer.

15. An article made by a photo-process, the photo-process comprising:

depositing a photo-sensitive resist layer having a thickness greater than about 60 microns on a substrate;

exposing the photo-sensitive resist layer having a thickness greater than about 60 microns to a pattern of actinic radiation where a via structure having a width of less than about 10 microns wide is to be formed;

developing the pattern exposed resist layer to form said via structure having a width less than about 10 microns, said via structure being developed such that a residue of resist material remains at the bottom of said via structure;

exposing said via structure to electron beam radiation having energy of less than about 6 KeV and dosage of less than about 200 $\mu C/cm^2$ to render said residue soluble in a developer solution; and thereafter developing the pattern exposed resist layer a second time such that said residue of resist material is removed from the bottom of said via structure.

16. The article of claim 15 wherein the energy of the electron beam radiation is between about 2 KeV and about 4 KeV.

17. The article of claim 15 wherein the dosage of the electron beam radiation is between about 50 $\mu C/cm^2$ and about 150 $\mu C/cm^2$.

18. The article of claim 15 wherein exposing said via structure to electron beam radiation includes exposing the entire resist layer to electron beam radiation.

19. The article of claim 15 further comprising plating a conductive material within said via structure after developing the pattern exposed resist layer a second time.

20. The article of claim 15 wherein the substrate includes a density at least two times the density of the deposited resist layer, the substrate selected from the group consisting of silicon, gallium arsenide, and alumina.

* * * * *